(12) United States Patent
Golan et al.

(10) Patent No.: US 9,710,329 B2
(45) Date of Patent: Jul. 18, 2017

(54) ERROR CORRECTION BASED ON HISTORICAL BIT ERROR DATA

(71) Applicant: SANDISK TECHNOLOGIES INC., Plano, TX (US)

(72) Inventors: Ronen Golan, Petah-Tikva (IL); Idan Alrod, Herzeliya (IL); Eli Elmoalem, Nili (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 16 days.

(21) Appl. No.: 14/871,459

(22) Filed: Sep. 30, 2015

(65) Prior Publication Data

US 2017/0091028 A1    Mar. 30, 2017

(51) Int. Cl.
G11C 29/00 (2006.01)
G06F 11/10 (2006.01)
G11C 29/52 (2006.01)

(52) U.S. Cl.
CPC .......... G06F 11/1072 (2013.01); G11C 29/52 (2013.01)

(58) Field of Classification Search
CPC .................... G06F 11/1072; G11C 29/52
See application file for complete search history.

(56) References Cited

U.S. PATENT DOCUMENTS

| | | | |
|---|---|---|---|
| 8,711,625 B2 | 4/2014 | Li et al. | |
| 8,924,824 B1 | 12/2014 | Lu | |
| 9,086,982 B1 | 7/2015 | Xu et al. | |
| 2011/0231738 A1 | 9/2011 | Horisaki | |
| 2012/0144272 A1* | 6/2012 | Franceschini | G06F 11/1012 714/773 |
| 2013/0163330 A1 | 6/2013 | Sharon | |
| 2014/0043904 A1 | 2/2014 | Kim et al. | |
| 2014/0153331 A1 | 6/2014 | Jang et al. | |
| 2014/0157087 A1 | 6/2014 | Yurzola et al. | |
| 2016/0328284 A1* | 11/2016 | Healy | G06F 11/1004 |

* cited by examiner

*Primary Examiner* — Sam Rizk
(74) *Attorney, Agent, or Firm* — Toler Law Group, PC

(57) ABSTRACT

A data storage device includes a memory including a plurality of storage elements. The data storage device further includes a controller coupled to the memory. The controller includes an error correction code (ECC) engine. The controller further includes a reliability engine configured to access historical bit error data. The historical bit error data includes a first count of bit errors associated with a first set of storage elements of the plurality of storage elements. The reliability engine is configured to generate reliability information based on the historical bit error data and to provide the reliability information to the ECC engine.

26 Claims, 6 Drawing Sheets

ERROR CORRECTION BASED ON HISTORICAL BIT ERROR DATA

FIELD OF THE DISCLOSURE

The present disclosure is generally related to error correction based on historical bit error data.

BACKGROUND

Data storage devices may include decoders, such as error correction code (ECC) engines, that are used to decode data read from memories of the data storage devices and to correct errors in the data. Some ECC engines use soft bits that indicates probabilities that one or more bits are correct (or incorrect) in order to decode a representation of data and to correct one or more errors. The soft bits may be generated by applying multiple read voltages to storage elements, and comparing voltages read from the storage elements to multiple thresholds. Additionally, the soft bits may be generated based on bit line defect information. Bit line defect information may indicate which bit lines of a memory are "bad bit lines." Bad bit lines refer to bit lines that have defects (e.g., faults, flaws, and/or "errors"). At least some storage elements coupled to bad bit lines may have a high likelihood of storing incorrect data. The bit line defect information may be generated based on tests performed during fabrication and production of a data storage device. Because the bit line defect information is generated during fabrication and production, the bit line defect information indicates bad bit lines that are detected prior to a significant portion of the operational lifetime of the device. Additionally, the bit line defect information may not indicate "weak" bit lines. Weak bit lines refers to bit lines that are not initially defective, however storage elements coupled to weak bit lines are more likely than other storage elements to occasionally store incorrect data.

DETAILED DESCRIPTION

Figure 1:
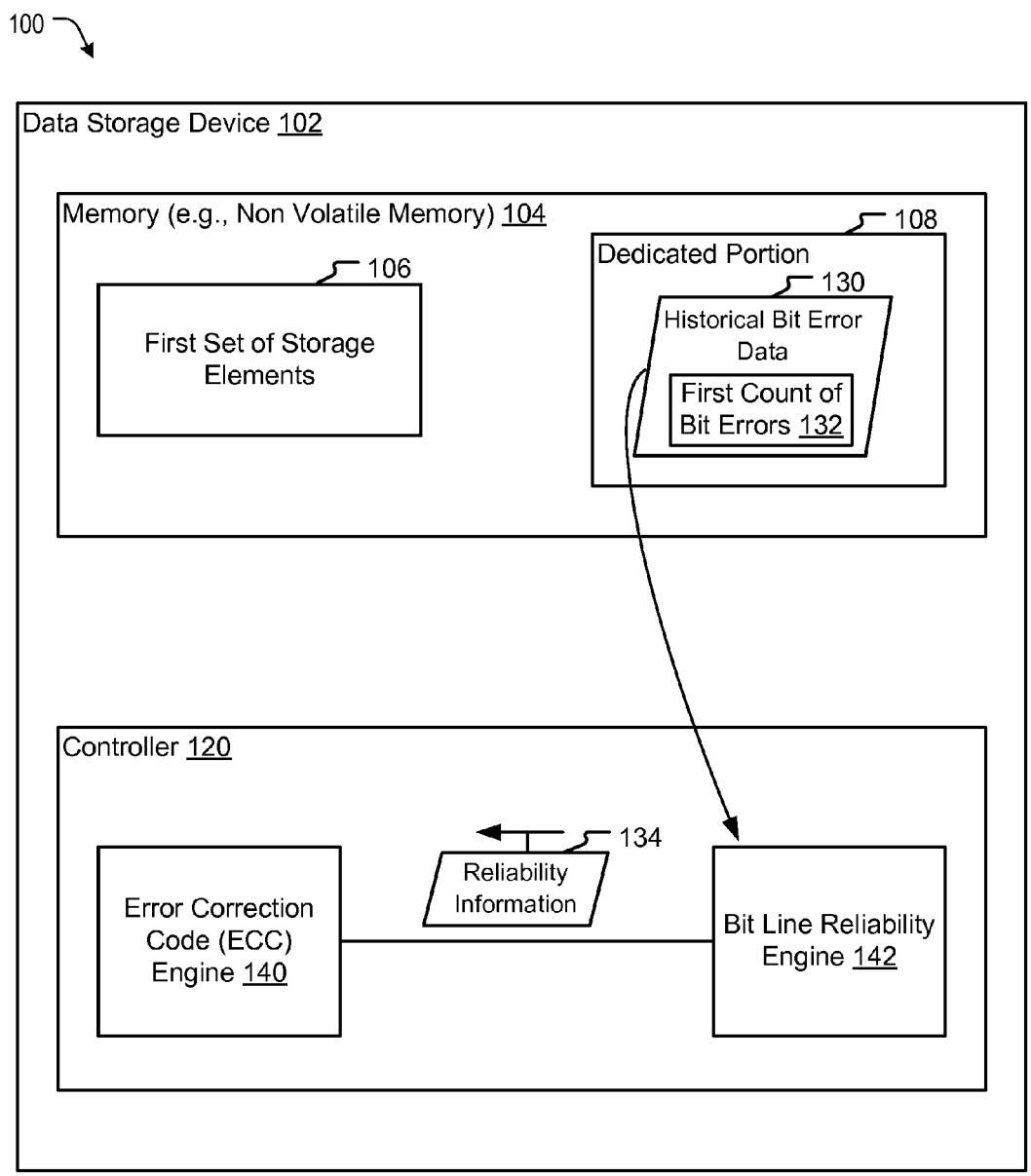
FIG. 1 is a block diagram of a first particular illustrative example of a system configured to generate reliability information based on historical bit error data.

Particular implementations are described with reference to the drawings. In the description, common features are designated by common reference numbers throughout the drawings. As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

The present disclosure provides systems, devices, and methods of generating reliability information based on historical bit error data. The historical bit error information may include counts of bit errors determined during the lifetime of a memory. For example, the historical bit error data may include counts of bit errors detected by an error correction coding (ECC) engine during performance of decode operations (either in response to a read operation or during a background operation). The counts of bit errors may be maintained during an operational lifetime of the memory and may be used to determine reliability information associated with sets of storage elements of the memory. The reliability information may enable the ECC engine to converge faster, and using less power, when decoding data read from the memory, as compared to decoding the data without using reliability information. Additionally, because the counts of bit errors are maintained during the operation lifetime of the memory, the counts of bit errors may enable identification of "weak" bit lines or defective bit lines that become defective (e.g., have defects) after initial testing to the memory.

The historical bit error data may be maintained and updated during an operational lifetime of the memory so that the historical bit error data remains current. For example, when the ECC engine detects that a bit value read from a first set of storage elements has an incorrect value, a count of bit errors associated with the first set of storage elements may be incremented. When the count of bit errors exceeds a threshold, reliability information associated with the first set of storage elements may have a first value (a low value or low reliability), and the reliability information may have a second value (a high value or high reliability) when the count fails to exceed the threshold. In this manner, the historical bit error data may be used to track sets of storage elements having a high number of errors and to generate reliability information indicating the unreliability of data read from sets of storage elements. Because the reliability information is generated based on the historical bit error data instead of initial bit line defect information, sets of storage elements having low reliability, and therefore defective bit lines, may be identified during the lifetime of the memory. Thus, defective bit lines that are missed during initial testing or that develop later in the operational lifetime of the memory may be compensated for using the reliability information. The reliability information may increase speed and reduce power consumption of the ECC engine when decoding data.

Referring to FIG. 1, a particular illustrative example of a system is depicted and generally designated 100. The system 100 includes a data storage device 102. The data storage device 102 includes a controller 120 and a memory 104 that is coupled to the controller 120. In some implementations, the memory 104 is a non-volatile memory.

In a particular implementation, the memory 104 includes a Flash memory. The memory 104 includes a plurality of storage elements configured to store data. The memory 104 may have a two-dimensional (2D) memory configuration. Alternatively, the memory 104 may have another configuration, such as a three-dimensional (3D) memory configuration. For example, the memory 104 may include a three-dimensional (3D) memory configuration that is monolithically formed in one or more physical levels of arrays of memory cells having an active area disposed above a silicon substrate. In other implementations, the memory 104 may include a volatile memory. The memory 104 may include one memory die or multiple memory dies. In some implementations, the memory 104 includes circuitry associated with operation of the storage elements.

In a particular implementation, the plurality of storage elements includes multi-level cell (MLC) storage elements. A state of an MLC storage element may represent multiple values. In other implementations, the plurality of storage elements includes single level cell (SLC) storage elements. A state of a SLC storage element may indicate one of two possible values. In other implementations, the plurality of storage elements may include MLC storage elements and SLC storage elements.

The plurality of storage elements includes a first set of storage elements 106. The first set of storage elements 106 may include one or more groupings of storage elements, such as word lines, groups of word lines, blocks, planes, logical pages, physical pages, or a combination thereof. The memory 104 may include multiple dies, and each die may be organized into multiple groups of storage elements (e.g., blocks, logical pages, and/or physical pages). The memory 104 may also include a dedicated portion 108 (e.g., one or more storage elements) configured to store historical bit error data 130.

The historical bit error data 130 may include one or more counts of bit errors associated with one or more sets of storage elements. For example, the historical bit error data 130 may include a first count of bit errors 132 associated with the first set of storage elements 106. The first set of storage elements 106 may correspond to a single storage element, a group of storage elements coupled to a bit line, a group of storage elements coupled to a column (e.g., a plurality of bit lines), or some other grouping of storage elements. The first count of bit errors 132 may track a number of bit errors detected by the controller 120 during one or more decode operations performed on data read from the first set of storage elements 106, as further described herein. Bit errors may also be referred to as "bit flips" because a bit having a bit error may be changed (e.g., "flipped") to a different value during a decoding operation. Although one count of bit errors is illustrated in FIG. 1, the historical bit error data 130 may include multiple counts of bit errors. For example, the memory 104 may include a second set of storage elements, and the historical bit error data 130 may include a second count of bit errors associated with the second set of storage elements.

In some implementations, the historical bit error data 130 may include counts of bit errors corresponding to columns of the memory 104. For example, the first set of storage elements 106 may include a group of storage elements coupled to a column (e.g., a group of multiple bit lines, such as eight or sixteen bit lines) of the memory 104, and the first count of bit errors 132 may track a number of bit errors associated with the group of storage elements coupled to the column. In some implementations, the historical bit error data 130 may include counts of bit errors corresponding to bit lines of the memory 104. For example, the first set of storage elements 106 may include a group of storage elements coupled to a bit line of the memory 104, and the first count of bit errors 132 may track a number of bit errors associated with the group of storage elements coupled to the bit line. In some implementations, the historical bit error data 130 may include counts of bit errors corresponding to individual storage elements of the memory 104. For example, the first set of storage elements 106 may include a single storage element, and the first count of bit errors 132 may track a number of bit errors associated with the single storage element. The granularity of the historical bit error data 130 may be selected during design of the memory 104 based on the competing considerations of granularity of the historical bit error data 130 and size of the dedicated portion 108. For example, the size of the dedicated portion 108 may be significantly larger if the historical bit error data 130 tracks counts of bit errors associated with individual storage elements as compared to counts of bit errors associated with columns.

In some implementations, the historical bit error data 130 may be generated during manufacture (e.g., during fabrication and testing) of the memory 104. In this implementation, the historical bit error data 130 may be updated during the operational lifetime of the memory 104, as further described herein. In other implementations, the historical bit error data 130 may be generated during the operational lifetime of the memory 104, and may not initially be generated during manufacture. In these implementations, as the historical bit error data 130 is generated and maintained by the controller 120, the historical bit error data 130 may be stored in the dedicated portion 108 of the memory 104. For example, the historical bit error data 130 may be periodically stored in memory 104. As another example, the historical bit error data 130 may be stored in the memory 104 prior to a power-down operation at the controller 120. In other implementations, the historical bit error data 130 may be stored at different times.

In some implementations, the historical bit error data 130 may include counts of bit errors for a particular number of sets of storage elements. For example, the historical bit error data 130 may include counts of bit errors for 20, or 50, sets of storage elements. In a particular implementation, the sets of storage elements may be initially identified as having more bit errors than other sets of storage elements during a testing process during manufacture of the memory 104. In another particular implementation, the sets of storage elements may be identified as "problem sets" during the operational lifetime of the memory 104. For example, the controller 120 may be configured to maintain more counts of bit errors than are stored as the historical bit error data 130, and the historical bit error data 130 may include the counts of bit errors having the highest number of errors. In another particular implementation, the historical bit error data 130 may include counts of bit errors associated with frequently accessed sets of storage elements. For example, particular sets of storage elements (e.g., sets of storage elements storing boot code, an operating system, etc.) in the memory 104 may be more frequently accessed that other sets of storage elements (e.g., sets of storage elements storing user data). In this implementation, the historical bit error data 130 may include counts of bit errors associated with the more frequently accessed sets of storage elements. In other implementations, other techniques may be used to determine which sets of storage elements are associated with the counts of bit errors included in the historical bit error data 130.

The controller 120 includes a reliability engine 142 and an error correction code (ECC) engine 140. The reliability engine 142 may be configured to access the historical bit error data 130. In a particular implementation, the historical bit error data 130 may be accessed from the memory 104. In another implementation, the historical bit error data 130 may be accessed from a controller memory, as further described with reference to FIG. 2. The reliability engine 142 may also be configured to generate reliability information 134 based on the historical bit error data 130 and to provide the reliability information 134 to the ECC engine 140. In some implementations, the reliability engine 142 may be referred to as a bit line reliability engine because the reliability engine 142 may identify reliability levels associated with bit lines, as further described herein.

The ECC engine 140 may be configured to process the reliability information 134 to decode one or more bits read from the first set of storage elements 106, as further described herein. The ECC engine 140 may include a decoder configured to decode read data, such as ECC codewords (e.g., including a data portion and a parity portion) using an ECC decoding technique. For example, the ECC engine 140 may receive an ECC codeword from the memory 104 (based on a read command) and may decode the ECC coded word to generate read data. The decoder (or the ECC engine 140 if the ECC engine 140 does not include a separate decoder) may decode the ECC codeword using an ECC decoding technique. The ECC engine 140 may include a Reed-Solomon decoder, a Bose-Chaudhuri-Hocquenghem (BCH) decoder, a low-density parity check (LDPC) decoder, a turbo decoder, a decoder configured to decode the data according to one or more other ECC techniques, or a combination thereof, as illustrative, non-limiting examples. The ECC engine 140 may decode the data based on the reliability information 134, as further described herein. The ECC engine 140 may also be configured to receive data and to generate one or more ECC code words based on the data. For example, the ECC engine 140 may receive write data (e.g., based on a write command) and may generate an ECC codeword to be stored in the memory 104.

The reliability information 134 indicates a reliability of one or more bits read from the first set of storage elements 106. For example, reliability information generated based on the first count of bit errors 132 of the historical bit error data 130 may indicate a reliability of data read from the first set of storage elements 106. Generating the reliability information 134 based on the historical bit error data 130 may include comparing the first count of bit errors 132 to a threshold and selecting a reliability level based on the comparison.

To illustrate, during a read operation of data stored at the first set of storage elements 106, the reliability engine 142 may receive the historical bit error data 130 from the memory 104. The historical bit error data 130 may be received in response to a read operation performed at the memory 104. In some implementations, the historical bit error data 130 may be maintained in a memory of the controller 120, such as a random access memory (RAM), as further described with reference to FIG. 2. The reliability engine 142 may be configured to identify, in the historical bit error data 130, a count of bit errors (e.g., the first count of bit errors 132) corresponding to the first set of storage elements 106. The reliability engine 142 may be configured to compare the first count of bit errors 132 to a threshold, and a value of the reliability information 134 generated by the reliability engine 142 may be based on the comparison. The threshold may indicate a number of errors associated with the storage element having low reliability.

In a particular implementation, if the first count of bit errors 132 exceeds the threshold, the reliability information 134 may have a first value indicating a low reliability level. However, if the first count of bit errors 132 fails to exceed the threshold, the reliability information 134 may have a second value indicating a high reliability level. In another particular implementation, multiple thresholds may be used. To illustrate, if the first count of bit errors 132 fails to exceed a first threshold, the reliability information 134 may indicate a high reliability level. In this implementation, if the first count of bit errors 132 exceeds the first threshold and fails to exceed a second threshold, the reliability information 134 may indicate a medium reliability level. In this implementation, if the first count of bit errors 132 exceeds the second threshold, the reliability information 134 may indicate a low reliability level. In other implementations, other numbers of thresholds may be used, and other levels of reliability may be indicated by the reliability information 134.

The reliability engine 142 may provide the reliability information 134 to the ECC engine 140 for processing. The ECC engine 140 may be configured to receive the reliability information 134 from the reliability engine 142 and to decode data read from the memory 104 based on the reliability information 134. For example, the ECC engine 140 may receive data read from the memory 104 during performance of a read operation. The data may include a one or more bit values that are read from the first set of storage elements 106. The ECC engine 140 may decode the data read from the memory 104 based on the reliability information 134. The ECC engine 140 may process the one or more bits read from the first set of storage elements 106 based on the reliability information 134. To illustrate, if the reliability information 134 indicates that the one or more bit values from the first set of storage elements 106 have a low reliability level, the one or bits may be processed by the ECC engine 140 as having low reliability of being correct. If the reliability information 134 indicates that the one or more bit values read from the first set of storage elements 106 have a high reliability level, the one or more bits may be processed by the ECC engine 140 as having high reliability of being correct. In a particular implementation, the reliability engine 142 may perform a normalization operation on the historical bit error data 130 prior to generating the reliability information 134, as further described with reference to FIG. 2.

The ECC engine 140 may also be configured to detect one or more bit errors during a decode operation performed on data read from the memory 104. For example, in response to a read operation, the ECC engine 140 may receive data from the memory 104 and, during a decode operation, may detect one or more bit errors in the data. The ECC engine 140 may track the number of bit errors detected and may track which storage element (or set of storage elements) that the bit errors are associated with. The ECC engine 140 may provide an indication of the one or more bit errors to the reliability engine 142, and the reliability engine 142 may update the historical bit error data 130 based on the indication of one or more bit errors, as further described with reference to FIG. 2. In this manner, the historical bit error data 130 may be maintained and updated during an operational lifetime of the memory 104. Additionally, the reliability engine 142 may store the updated historical bit error data 130 at the memory 104 (e.g., at the dedicated portion 108), as further described with reference to FIG. 2.

During operation, the controller 120 may read data from the memory 104. The data may include data stored at the first set of storage elements 106. Responsive to the read operation, the reliability engine 142 may receive the historical bit error data 130 from the memory 104 (e.g., from the dedicated portion 108). The reliability engine 142 may generate the reliability information 134 based on the historical bit error data 130. For example, the reliability engine 142 may generate the reliability information 134 indicating a particular reliability level based on whether the first count of bit errors 132 exceeds a threshold. The reliability engine 142 may provide the reliability information 134 to the ECC engine 140, and the ECC engine 140 may process the reliability information 134 to decode the data read from the memory 104 (including from the first set of storage elements 106).

The reliability information 134 may enable the ECC engine 140 to converge faster and consume less power than decoding data read from the memory 104 without using reliability information. For example, the ECC engine 140 may perform fewer iterations during decoding as compared to an ECC engine that does not use reliability information. Additionally, generating the reliability information 134 may be faster and may use less processing resources than generating other forms of soft bits. For example, the reliability information 134 may be generated without performing multiple sensing operations at the memory 104 to determine whether charges of storage elements are closer to one or more threshold levels, as is performed to generate other soft bits. Thus, reliability engine 142 may generate the reliability information 134 without an increase in overhead and processing resources associated with generating soft bits. Additionally, the counts of bit errors in the historical bit error data 130 may be used to identify "weak" bit lines that are unable to be identified during initial testing. A weak bit line may refer to a bit line that, due to a characteristic of the bit line, causes one or more storage elements coupled to the bit line to store incorrect data more frequently than other storage elements. Although referred to as "incorrect" data, the data may be data having a different value compared to the write data sent to the memory. For example, a string of bits "0101" may be written to storage elements coupled to the weak bit line, but the states of the storage elements may correspond to the string of bits "0100" after writing. However, a storage element coupled to a weak bit line may sometimes store correct data, so the weak bit line may not be identified during initial testing. Additionally, the likelihood that a storage element coupled to a weak bit line stores incorrect data may increase with the number of times the storage element is programmed or erased. Because the counts of bit errors are maintained and updated during the operational lifetime of the memory 104, the counts of bit errors may enable identification of weak bit lines that are otherwise unidentified during initial testing.

Figure 2:
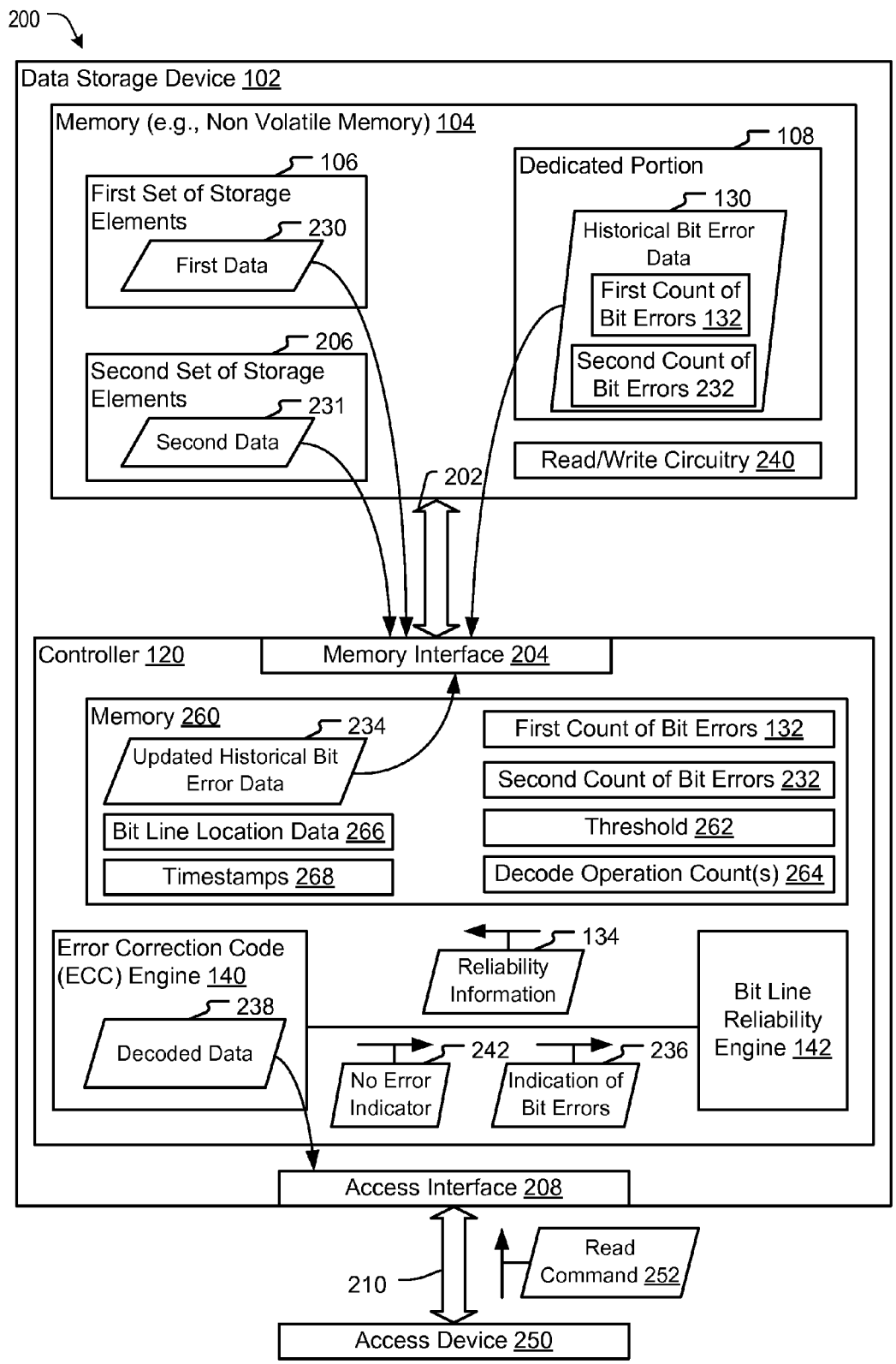
FIG. 2 is a block diagram of a second particular illustrative example of a system configured to generate reliability information based on historical bit error data.

Referring to FIG. 2, a block diagram of a second illustrative example of a system configured to generate reliability information based on historical bit error data is disclosed and designated 200. The system 200 includes the data storage device 102 and an access device 250. The data storage device 102 includes memory 104 and the controller 120 of FIG. 1. The controller 120 includes the ECC engine 140 and the reliability engine 142 of FIG. 1. Additional components of the system 200 are also illustrated in FIG. 2.

The data storage device 102 and the access device 250 may be coupled via a connection (e.g., a communication path 210), such as a bus or a wireless connection. For example, the data storage device 102 may include an access interface 208 that enables communication via the communication path 210 between the data storage device 102 and the access device 250, such as when the access interface 208 is communicatively coupled to the access device 250. In some implementations, the data storage device 102 may be embedded within the access device 250, such as in accordance with a Joint Electron Devices Engineering Council (JEDEC) Solid State Technology Association Universal Flash Storage (UFS) configuration. Alternatively, the data storage device 102 may be removable from the access device 250 (i.e., "removably" coupled to the access device 250). As an example, the data storage device 102 may be removably coupled to the access device 250 in accordance with a removable universal serial bus (USB) configuration. In some implementations, the data storage device 102 may include or correspond to a solid state drive (SSD) which may be included in, or distinct from (and accessible to), the access device 250. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 250 indirectly, e.g., via a network. For example, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 250 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

In some implementations, the data storage device 102 and the access device 250 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples. The one or more protocols may include a standardized protocol and/or a non-standardized protocol, such as a proprietary protocol. In some implementations, the data storage device 102 and the access device 250 may be configured to communicate using dual channel communication (e.g., both devices may issue and receive commands from the other device).

The access device 250 may include a memory interface (not shown) and may be configured to communicate with the data storage device 102 via the memory interface to read data from and write data to the memory 104 of the data storage device 102. For example, the access device 250 may operate in compliance with a Joint Electron Devices Engineering Council (JEDEC) industry specification, such as a Universal Flash Storage (UFS) Access Controller Interface specification. As other examples, the access device 250 may operate in compliance with one or more other specifications, such as a Secure Digital (SD) Access Controller specification, as an illustrative, non-limiting example. The access device 250 may communicate with the memory 104 in accordance with any other suitable communication protocol.

The access device 250 may include a processor and a memory. The memory may be configured to store data and/or instructions that are executable by the processor. The memory may be a single memory or may include multiple memories, such as one or more non-volatile memories, one or more volatile memories, or a combination thereof. The access device 250 may issue one or more commands to the data storage device 102, such as one or more requests to erase data, read data from, or write data to the memory 104 of the data storage device 102. For example, the access device 250 may be configured to provide data to be stored at the memory 104 or to request data to be read from the memory 104. The access device 250 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The controller 120 may be configured to receive data and/or instructions from the access device 250 and to provide data and/or instructions to the memory 104. The controller 120 is coupled to the memory 104 via a bus 202, an interface (e.g., interface circuitry, such as a memory interface 204), another structure, or a combination thereof. The controller 120 and the memory 104 may exchange information via the bus 202, the memory interface 204, or a combination thereof. For example, one or more of read data, the historical bit error data 130, read requests, write requests, write data, and other data or instructions may be exchanged via the bus 202, the memory interface 204, or a combination thereof, may be exchanged between the controller 120 and the memory 104.

The controller 120 is configured to receive data and instructions from the access device 250 and to send data to the access device 250. For example, the controller 120 may send data to the access device 250 via the access interface 208, and the controller 120 may receive data from the access device 250 via the access interface 208. The controller 120 is configured to send data and commands to the memory 104 and to receive data from the memory 104. For example, the controller 120 is configured to send data and a write command to cause the memory 104 to store data to a specified address of the memory 104. The write command may specify a physical address of storage element(s) within a portion (e.g., a block) of the memory 104 that is to store the data. The controller 120 is configured to send a read command to the memory 104 to access data from a specified address of the memory 104. The read command may specify the physical address of storage element(s) of a portion (e.g., a block) of the memory 104 (e.g., a physical address of a word line of coupled to the storage elements).

The read command to the memory 104 may be based on a read command 252 from the access device 250. For example, the access device 250 may send the read command 252 to the controller 120 via the communication path 210, the access interface 208, or a combination thereof. Based on the read command 252, the controller 120 is configured to send read requests for data (e.g., read commands) to the memory 104 and to receive representations of data from the memory 104. The controller 120 is configured to decode the representations of data based on the reliability information 134, as further described herein. The controller 120 is also configured to send decoded data to the access device 250 via the communication path 210, the access interface 208, or a combination thereof.

As illustrated in FIG. 2, the memory 104 includes the first set of storage elements 106, a second set of storage elements 206, the dedicated portion 108, and read/write circuitry 240. The first set of storage elements 106 and the second set of storage elements 206 may each correspond to a single storage element, a group of storage elements coupled to a bit line, a group of storage elements coupled to a column (e.g., a plurality of bit lines), or some other grouping of storage elements. The first set of storage elements 106 may store first data 230 and the second set of storage elements 206 may store second data 231. The dedicated portion 108 may be configured to store the historical bit error data 130, as described with reference to FIG. 1. In a particular implementation, the dedicated portion 108 may comprise single level cell (SLC) storage elements. Storing the historical bit error data 130 in SLC storage elements may decrease a likelihood of errors due to writing or reading the historical bit error data 130. In other implementations, the dedicated portion 108 may be other types of memory.

The historical bit error data 130 may include multiple counts of bit errors that are associated with multiple sets of storage elements of the memory 104. As illustrated in FIG. 2, the historical bit error data 130 may include the first count of bit errors 132 and a second count of bit errors 232. The first count of bit errors 132 may be associated with the first set of storage elements 106. To illustrate, the first count of bit errors 132 may track a number of errors detected during one or more decoding processes performed on data read from the first set of storage elements 106 (e.g., the first data 230). The second count of bit errors 232 may be associated with the second set of storage elements 206. To illustrate, the second count of bit errors 232 may track a number of errors detected during one or more decoding processes performed on data read from the second set of storage elements 206 (e.g., the second data 231). In other implementations, the historical bit error data 130 may include more than two or fewer than two counts of bit errors.

The historical bit error data 130 may track bit errors during an operation lifetime of the memory 104. For example, as further described herein, the ECC engine 140 may detect one or more errors in a representation of the first data 230 during a decode operation. The decode operation may be performed as part of a read operation (e.g., a read initiated by the controller 120 based on a command from the access device 250) or part of a background scanning operation (e.g., a "Read Scrub"). The historical bit error data 130 may be updated based on one or more detected errors during the operational lifetime of the memory 104. For example, during a read operation, the ECC engine 140 may detect one or more errors associated with a representation of the first data 230 during one or more decode operations. The first count of bit errors 132 may be modified (e.g., incremented) to account for the detected one or more errors, as further described herein, and the updated historical bit error data 130 may be stored in the memory 104. In this manner, the historical bit error data 130 represents bit error data up to a "present" time, and thus the historical bit error data 130 is responsive to changes in the memory 104 (e.g., new bit line defects) that occur during the operational lifetime of the memory.

The memory 104 also includes support circuitry, such as the read/write circuitry 240, to support operation of the memory 104. Although depicted as a single component, the read/write circuitry 240 may be divided into separate components of the memory 104, such as read circuitry and write circuitry. The read/write circuitry 240 may be configured to read a representation of data from or to write data to one or more group of storage elements of the memory 104 based on requests from the controller 120. For example, the read/write circuitry 240 may be configured to read data stored at a particular group of storage elements in response to a read request from the controller 120. To illustrate, the controller 120 may send a first read request to the memory 104, the first read request indicating an address that corresponds to the first set of storage elements 106. In response to the first read request, the read/write circuitry 240 may sense the first data 230 that is stored at the first set of storage elements 106, and a representation of the first data 230 may be provided to the controller 120. In a particular implementation, the historical bit error data 130 is provided with the representation of the first data 230 to the controller 120. In another particular implementation, the historical bit error data 130 may be retrieved and provided to the controller 120 in response to a power-on operation at the controller 120.

As another example, the controller 120 may send a second read request to the memory 104, the second read request indicating an address that corresponds to the second set of storage elements 206. In response to the second read request, the read/write circuitry 240 may sense the second data 231 that is stored at the first second of storage elements 206, and a representation of the second data 231 may be provided to the controller 120. In a particular implementation, the historical bit error data 130 is provided with the representation of the second data 231 to the controller 120. In other implementations, the historical bit error data 130 may be provided to the controller 120 in response to receiving a request for the historical bit error data 130 from the controller 120.

In addition to the memory 104, the data storage device 102 includes the controller 120. The controller 120 includes the ECC engine 140, the reliability engine 142, and a second memory 260. The second memory 260 may be used to store information maintained by the controller 120. The second memory 260 may be referred to as a controller memory and may be a volatile memory, such as a random access memory (RAM), as a non-limiting example. The second memory 260 may store instructions (not illustrated) that, when executed by the controller 120, cause the controller 120 to perform the operations described herein. Additionally, the second memory 260 may store information used to generate the reliability information 134, such as the historical bit error data 130 (or the first count of bit errors 132 and the second count of bit errors 232, as illustrated in FIG. 2).

As described with reference to FIG. 1, the reliability engine 142 is configured to generate the reliability information 134 based on the historical bit error data 130. For example, during a read operation that reads data from the memory 104, the reliability engine 142 may generate the reliability information 134. The reliability information 134 may indicate whether data read from a particular set of storage elements of the memory 104 is reliable (e.g., has a particular reliability level) based on a comparison of a count of bit errors associated with the particular set of storage elements and a threshold 262. To illustrate, the reliability engine 142 may access the historical bit error data 130 and may compare the first count of bit errors 132 to the threshold 262. The historical bit error data 130 may be accessed from the second memory 260 or from the memory 104. If the first count of bit errors 132 exceeds the threshold 262, the reliability information 134 may include a first reliability value indicating a first level (e.g., a low reliability level). If the first count of bit errors 132 fails to exceed the threshold 262, the first reliability value may indicate a second level (e.g., a high reliability level). The first reliability value is associated with the first set of storage elements 106. The reliability information 134 may also include a second reliability value associated with the second set of storage elements 206, and the second reliability value may be generated based on a comparison of the second count of bit errors 232 to the threshold 262. Although FIG. 2 illustrates one threshold, in other implementations, multiple thresholds may be used, and the reliability values may indicate more than two reliability levels.

The ECC engine 140 may be configured to receive the reliability information 134 from the reliability engine 142 and to decode data read from the memory 104 using the reliability information 134. As an example, during a read operation of the first data 230 and the second data 231, the ECC engine 140 may decode the first data 230 and the second data 231 using the reliability information 134. To further illustrate, the ECC engine 140 may be configured to decode a first ECC code word (e.g., the first data 230) based on a parity portion of the ECC code word and based on the reliability information 134. The ECC engine 140 may use the reliability information 134 in place of (or in addition to) one or more soft bits corresponding to the first data 230 to decode the first data 230. Additionally, the ECC engine 140 may use the reliability information 134 in place of (or in addition to) one or more soft bits corresponding to the second data 231 to decode the second data 231. The reliability information 134 may decrease power consumption of the ECC engine 140 and may increase a speed of the decoding operations performed by the ECC engine 140. In a particular implementation, the ECC engine 140 may be an LDPC encoder, and the reliability information 134 may reduce a number of steps performed during a decoding operation. As an illustrative example, the reliability information 134 may reduce a number of iterations performed by the ECC engine 140 prior to convergence on solution.

The ECC engine 140 may generate decoded data 238 by decoding the first data 230, the second data 231, or a combination thereof, based on the reliability information 134. The decoded data 238 may be generated faster than if the ECC engine 140 did not use the reliability information 134. Additionally, the decoded data 238 may be generated faster, and with less overhead, than decoding data using soft bits generated based on multiple sensing operations at the memory 104. Alternatively, the decoded data 238 may be generated using the reliability information 134 and one or more soft bits to improve accuracy of the decoded data 238.

In addition to generating the decoded data 238, the ECC engine 140 may be configured to detect one or more errors during decoding operations. For example, the ECC engine 140 may detect one or more bit errors associated with the first set of storage elements 106 (e.g., the first data 230) during performance of the decoding operation. To illustrate, the ECC engine 140 may detect a bit error if a bit value read from the memory 104 is determined to be an incorrect value during the decoding operation (e.g., based on parity bits, as an example). The ECC engine 140 may provide (e.g., send) an indication of bit errors 236 to the reliability engine 142.

The ECC engine 140 may be configured to detect bit errors during each decode operation performed by the ECC engine 140. For example, during performance of each read command at the memory 104, the ECC engine 140 may detect bit errors and provide the indication of bit errors 236 to the reliability engine 142. Additionally, the ECC engine 140 may detect bit errors during background scanning operations of the memory 104. At least one type of background scanning operation may include a "read scrub."

The reliability engine 142 may be configured to receive the indication of bit errors 236 from the ECC engine 140 and to update the historical bit error data 130 based on the indication of bit errors 236. To illustrate, if the indication of bit errors 236 indicates one or more bit errors associated with the first set of storage elements 106, the reliability engine 142 may modify the first count of bit errors 132 based on a number errors associated with the first set of storage elements 106. As an illustrative example, if two errors are associated with the first set of storage elements 106, the first count of bit errors 132 may be incremented by two. As another example, if the indication of bit errors 236 indicates a single bit error associated with the second set of storage elements 206, the second count of bit errors 232 may be incremented by one. In this manner, multiple counts of bit errors may be updated (e.g., modified) based on the indication of bit errors 236. The multiple counts of bit errors (e.g., the first count of bit errors 132, the second count of bit errors 232, and other counts of bit errors) may be maintained at the second memory 260 during operation of the controller 120.

In some implementations, the multiple counts of bit errors may be incremented when the indication of bit errors 236 indicates that the number of bit errors detected during a read of a particular set of storage elements is the same or has increased as compared to the number of bit errors detected during a previous read operation of the particular set of storage elements. For example, during a second read operation of the first set of storage elements 106, the first count of bit errors 132 may be incremented when the indication of bit errors 236 indicates that the number of bit errors detected during the second read operation is equal to or exceeds the number of bit errors detected during a first read operation performed prior to the second read operation. When the indication of bit errors 236 indicates that the number of bit errors detected during a read operation is less than the number of bit errors detected during a previous read operation, the corresponding count of bit errors may be decremented, as further described herein.

By updating one or more counts of bit errors, the reliability engine 142 may generate updated historical bit error data 234. The reliability engine 142 may be configured to send the updated historical bit error data 234 to the memory 104 to be stored at the dedicated portion 108. The updated historical bit error data 234 may overwrite (e.g., replace) the historical bit error data 130. Thus, the historical bit error data 130 may represent "current" bit error data of the memory 104. In a particular implementation, the updated historical bit error data 234 may be sent to the memory 104 after each update of one or more count values. In another implementation, the updated historical bit error data 234 may be maintained at the second memory 260 and may be periodically stored at the memory 104. In another implementation, the updated historical bit error data 234 may be stored at the memory 104 prior to a power-off operation of the controller 120. In other implementations, the updated historical bit error data 234 may be stored to the memory 104 at different times.

In some implementations, the ECC engine 140 may be configured to identify when previously detected bit errors are not detected on a subsequent decoding of the same data. For example, if one or more bit errors are detected during a first decode of the first data 230 (e.g., during a first read operation), and no bit errors are detected during a subsequent decode of the first data 230 (e.g., during a subsequent read operation), the ECC engine 140 may provide a no-error indicator 242 to the reliability engine 142. The no-error indicator 242 may identify the first set of storage elements 106 (e.g., the storage elements from where the first data 230 was read) and may indicate that the first set of storage elements 106 are no longer associated with bit errors. The reliability engine 142 may be configured to modify (e.g., decrement), one or more counts of bit errors based on the no-error indicator 242. For example, if the no-error indicator 242 indicates that bit errors are no longer associated with the first set of storage elements 106, the first count of bit errors 132 may be decremented. Modifying the counts of bit errors based on the no-error indicator 242 may compensate for bit errors caused by less persistent conditions.

To illustrate, some bit errors detected by the ECC engine 140 may be based on persistent conditions, such as physical defects. However, some bit errors detected by the ECC engine 140 may be based on transient conditions, such as "read-disturb" conditions, "write-disturb" conditions, mobile charges, or other transient conditions. Because these conditions are transient, bit errors based on these conditions may be detected at particular times and not at later times. To compensate for transient errors, the ECC engine 140 may be configured to provide the no-error indicator 242 when data from a particular set of storage elements that was previously associated bit errors is no longer associated with bit errors (e.g., during a decode operation of a subsequent read operation to the particular set of storage elements). The reliability engine 142 may modify counts of bit errors based on the no-error indicator 242 to reduce the counts to compensate for errors detected due to transient conditions.

Additionally or alternatively, if the indication of bit errors 236 indicates that the number of bit errors detected during a read operation are fewer than the number of bit errors detected during a previous read operation, the corresponding count of bit errors may be decremented. For example, if the indication of bit errors 236 indicates that fewer bit errors are detected during a particular read operation of the first set of storage elements 106 than during a previous read operation of the first set of storage elements 106, the first count of bit errors 132 may be decremented. In some implementations, the ECC engine 140, the reliability engine 142, the controller 120, or a combination thereof, may be configured to maintain a most recent count of detected bit errors for the sets of storage elements for which the historical bit error data 130 is maintained. Reducing the counts of bit errors when detected errors decrease over time may compensate for errors detected due to transient conditions.

In some implementations, the reliability engine 142 may track a time when the counts of bit errors are updated via timestamps 268. The timestamps 268 may include one or more timestamps that indicate a most recent update time of a corresponding count of bit errors. The timestamps 268 may also be referred to as "time-tags." The reliability engine 142 may set a weight (e.g., a reliability information weight or reliability weight) of the reliability information 134 based on the timestamps 268. For example, reliability information generated based on a count of bit errors that corresponds to a more recent timestamp may have a higher weight than reliability information generated based on a count of bit errors that corresponds to an older timestamp.

To illustrate, the reliability engine 142 may receive the indication of bit errors 236 (indicating errors associated with the first set of storage elements 106), and the reliability engine 142 updates the first count of bit errors 132 and generates (or updates) a first timestamp of the timestamps 268. At a later time (e.g., during a subsequent decoding operation), the reliability engine 142 may receive a second indication of bit errors (indicating errors associated with the second set of storage elements 206), and the reliability engine 142 updates the second count of bit errors 232 and generates (or updates) a second timestamp of the timestamps 268. In this example, the second timestamp is more recent than the first timestamp. During a subsequent read operation addressed to the first set of storage elements 106 and the second set of storage elements 206, the reliability engine 142 generates the reliability information 134 based on the first count of bit errors 132 and the second count of bit errors 232. The reliability information 134 indicates a reliability associated with the first set of storage elements 106 and a reliability associated with the second set of storage elements 206. Because the second timestamp is more recent than the first timestamp, in this example the reliability associated with the second set of storage elements 206 has a higher weight than the reliability associated with the first set of storage elements 106. In other implementations, the timestamps 268 may be used to determine the reliability associated with a set of storage elements. As one example, if the first count of bit errors 132 and the second count of bit errors 232 each exceed the threshold 262, and the second count of bit errors 232 is associated with a timestamp that is more recent than a timestamp associated with the first count of bit errors 132, the second set of storage elements 206 may have a lower reliability level than the first set of storage elements 106.

In some implementations, the counts of bit errors included in the historical bit error data 130 may track particular values of bit errors or particular error types. For example, the first count of bit errors 132 may track 0-to-1 errors associated with the first set of storage elements 106, and the reliability engine 142 may also maintain a third count of bit errors that tracks 1-to-0 errors associated with the first set of storage elements 106. A 0-to-1 error refers to an error that is detected when a bit value is changed from a 0 value to a 1 value during decoding. A 1-to-0 error refers to an error that is detected when a bit value is changed from a 1 value to a 0 value during decoding. Although described as 1-to-0 errors and 0-to-1 errors, in other implementations, other types of errors (e.g., errors changing one value to a different value) may be individually tracked using corresponding counts of bit errors. The different errors may be associated with different weights for determining reliability information As an example, if a count of bit errors tracking 0-to-1 errors exceeds the threshold 262 and a count of bit error tracking 1-to-0 errors does not exceed the threshold 262, the corresponding set of storage elements may have a first reliability value, and if the count of bit errors tracking 0-to-1 errors does not exceed the threshold 262 and the count of bit errors tracking 1-to-0 errors exceeds the threshold 262, the corresponding set of storage elements may have a second reliability level that is less than the first reliability level. Additionally or alternatively, the different types of errors may be counted and compared to different thresholds. As an example, a particular set of storage elements may have a low reliability level when a count of bit errors tracking 0-to-1 errors exceeds a first threshold or when a count of bit errors tracking 1-to-0 errors exceeds a second threshold, where the first threshold and the second threshold are different values.

In some implementations, the reliability engine 142 may be configured to perform a normalization operation on a count of bit errors based on a count of decode operations. The normalization operation may compensate for differences in access frequency among different sets of storage elements of the memory 104. To illustrate, some sets of storage elements (e.g., sets of storage elements that store frequently accessed data, such as boot code, an operating system, or other frequently accessed data) may accessed more frequently than other sets of storage elements (e.g., sets of storage elements that store user data). If a particular set of storage elements is accessed significantly more times than another set of storage elements, the particular set of storage elements may be associated with more detected bit errors (e.g., due to the high frequency of access) even though the particular set of storage elements are not coupled to a weak or defective bit line. To compensate for frequency of access, counts of bit errors may be normalized.

To illustrate, the reliability engine 142 may maintain decode operation counts 264 in the second memory 260. The decode operation counts 264 may include one or more count values, and each count value may be associated with a set of storage elements. For example, the decode operation counts 264 may include a first count value associated with the first set of storage elements 106 and a second count value associated with the second set of storage elements 206. The decode operation counts 264 may track a number of decode operations performed on data read from one or more sets of storage elements. For example, the first count value of the decode operation counts 264 may track a number of decode operations performed on data (e.g., the first data 230) read from the first set of storage elements 106. The reliability engine 142 may be configured to normalize the first count of bit errors 132 based on the decode operation counts 264. For example, the first count of bit errors 132 may be reduced based on the first count value of the decode operation counts 264. An amount of reduction of the first count of bit errors 132 may be a predetermined amount or may be selected based on the first count value of the decode operation counts 264. In this manner, counts of bit errors included in the historical bit error data 130 may be normalized based on the decode operation counts 264 to compensate for differences in frequency of access between different sets of storage elements of the memory 104.

In some implementations, the reliability engine 142 may be configured to identify additional storage elements having a low reliability value based on a particular storage element that has a low reliability value. To illustrate, if the first set of storage elements 106 corresponds to a particular storage element and if the first count of bit errors 132 exceeds the threshold 262, the reliability engine 142 may identify other storage elements as having a low reliability value. The other storage elements are storage elements that are coupled to a same bit line as the particular storage element. To illustrate, a particular storage element may be associated with a large number of bit errors when the particular storage element is coupled to a bit line that has a defect (e.g., a fault, a flaw, or an "error") that affects (e.g., influences) the particular storage element. One type of defect may be referred to as a "closed" defect. A closed defect may be caused by a bit line being in contact with (e.g., shorted with) another bit line, and the closed defect may cause all storage elements coupled to the bit line to have a high likelihood of storing incorrect data.

Another type of defect may be referred to as an "open" defect. The open defect may affect some storage elements coupled to the bit line differently than other storage elements coupled to the bit line. For example, storage elements coupled to the bit line on one side of the open defect may have a high likelihood of storing incorrect data, however storage elements coupled to the bit line on the other side of the open defect may not have an increased likelihood of storing incorrect data. If the reliability engine 142 determines that a particular storage element is associated with a count of bit errors that exceeds the threshold 262, the reliability engine 142 may mark the bit line as defective in bit line location data 266 maintained in the memory. For example, the bit line location data 266 may include a table that indicates which bit lines, or which storage elements, are affected by defects (e.g., are associated with a low reliability level), and the reliability engine 142 may mark a table entry corresponding to the bit line coupled to the particular storage element. In some implementations, the location of the particular storage element along the bit line may be marked, and storage elements on one side of the particular storage element (in relation to the bit line) may be marked while storage elements on the other side of the particular storage element (in relation to the bit line) are not marked. When data is read from one or more marked storage elements, the reliability engine 142 may provide the reliability information 134 indicating a low reliability level to the ECC engine 140. In this manner, the reliability engine 142 may identify one or more storage elements as having a low reliability level even if data has not been read from the one or more storage elements a sufficient amount of times to cause a corresponding count of bit errors to exceed the threshold 262.

In some implementations, the historical bit error data 130 is compressed prior to storage at the dedicated portion 108 of the memory 104. In implementations where the controller 120 generates or updates the historical bit error data 130 and sends the historical bit error data 130 (or the updated historical bit error data 234) to the memory 104, the controller 120 may compress the historical bit error data 130 (or the updated historical bit error data 234) prior to storage of the historical bit error data 130 (or the updated historical bit error data 234) in the dedicated portion 108. In a particular implementation, the data compression operation may be a "start-run" compression operation. In other implementations, the data compression operation may be a different compression operation. The controller 120 may also be configured to perform a data decompression operation on the historical bit error data 130 prior to generating the reliability information 134. In a particular implementation, the data decompression operation may be a start-run decompression operation. In other implementations, the data decompression operation may be a different decompression operation.

During operation, the access device 250 sends the read command 252 to the controller 120. The read command 252 may include an address of the first set of storage elements 106 and the second set of storage elements 206. In response to the read command 252, the controller 120 reads the first data 230 from the first set of storage elements 106 and the second data 231 from the second set of storage elements 206. The reliability engine 142 accesses the historical bit error data 130 and generates the reliability information 134 based on the historical bit error data 130. For example, the reliability engine 142 compares the first count of bit errors 132 to the threshold 262 to determine a reliability level of the first data 230, and the reliability engine 142 compares the second count of bit errors 232 to the threshold 262 to determine a reliability level of the second data 231. The reliability engine 142 provides the reliability information 134 to the ECC engine 140, and the ECC engine 140 decodes the first data 230 and the second data 231 based on the reliability information 134 to generate the decoded data 238. The decoded data 238 is provided to the access device 250, via the access interface 208 and the communication path 210.

Additionally, the ECC engine 140 may detect one or more bit errors in the first data 230 or the second data 231 during decoding. If one or more bit errors are detected, the ECC engine 140 provides the indication of bit errors 236 to the reliability engine 142. The reliability engine 142 may update (e.g., by incrementing) the first count of bit errors 132, the second count of bit errors 232, or both, based on the indication of bit errors 236. Additionally, if no bit errors are detected with a set of storage elements where bit errors were previously detected, the ECC engine 140 may provide the no-error indicator 242 to the reliability engine 142. The reliability engine 142 may update (e.g., by decrementing) the first count of bit errors 132, the second count of bit errors 232, or both, based on the no-error indicator 242. By updating the first count of bit errors 132, the second count of bit errors 232, or both, the reliability engine 142 generates the updated historical bit error data 234, which may be stored at the memory 104 (e.g., at the dedicated portion 108).

Although one or more components of the data storage device 102 of FIGS. 1 and 2 have been described with respect to the controller 120, in other implementations certain components may be included in the memory 104. For example, one or more of the second memory 260, the reliability engine 142, and/or the ECC engine 140 may be included in the memory 104. Alternatively, or in addition, one or more functions as described above with reference to the controller 120 may be performed at or by the memory 104. For example, one or more functions of the second memory 260, the reliability engine 142, and/or the ECC engine 140 may be performed by components and/or circuitry included in the memory 104. Alternatively, or in addition, one or more components of the data storage device 102 may be included in the access device 250. For example, one or more of the second memory 260, the reliability engine 142, and/or the ECC engine 140 may be included in the access device 250. Alternatively, or in addition, one or more functions as described above with reference to the controller 120 may be performed at or by the access device 250. As an illustrative, non-limiting example, the access device 250 may be configured to generate the reliability information 134 based on the historical bit error data 130. In some implementations, the components of the controller 120, the memory 104, and/or the access device 250 may include or correspond to dedicated circuitry, an application-specific integrated circuit (ASIC), a field-programmable gate array (FPGA) device, or other dedicated hardware configured to perform the operation of the corresponding component. In other implementation, the components may include or correspond to instructions that are executable by a processor or a controller, as non-limiting examples, to perform the operations of the corresponding component.

Thus, the system 200 may enable data decoding operations at increased speed and decreased power consumption. The improved data decoding operations may be enabled by use of the reliability information 134 during decoding operations at the ECC engine 140. To illustrate, the reliability information 134 may reduce a number of steps performed during a decoding operation, thereby increasing speed and reducing power consumption of the ECC engine 140. The reliability information 134 may be generated with less overhead than other soft bits (which may use multiple sensing operations at the memory 104). Additionally, because the historical bit error data 130 is updated during the operational lifetime of the memory 104, the reliability information 134 may indicate low reliability levels for weak bit lines or based on bit line defects are not detected during initial testing of the memory 104.

Figure 3:
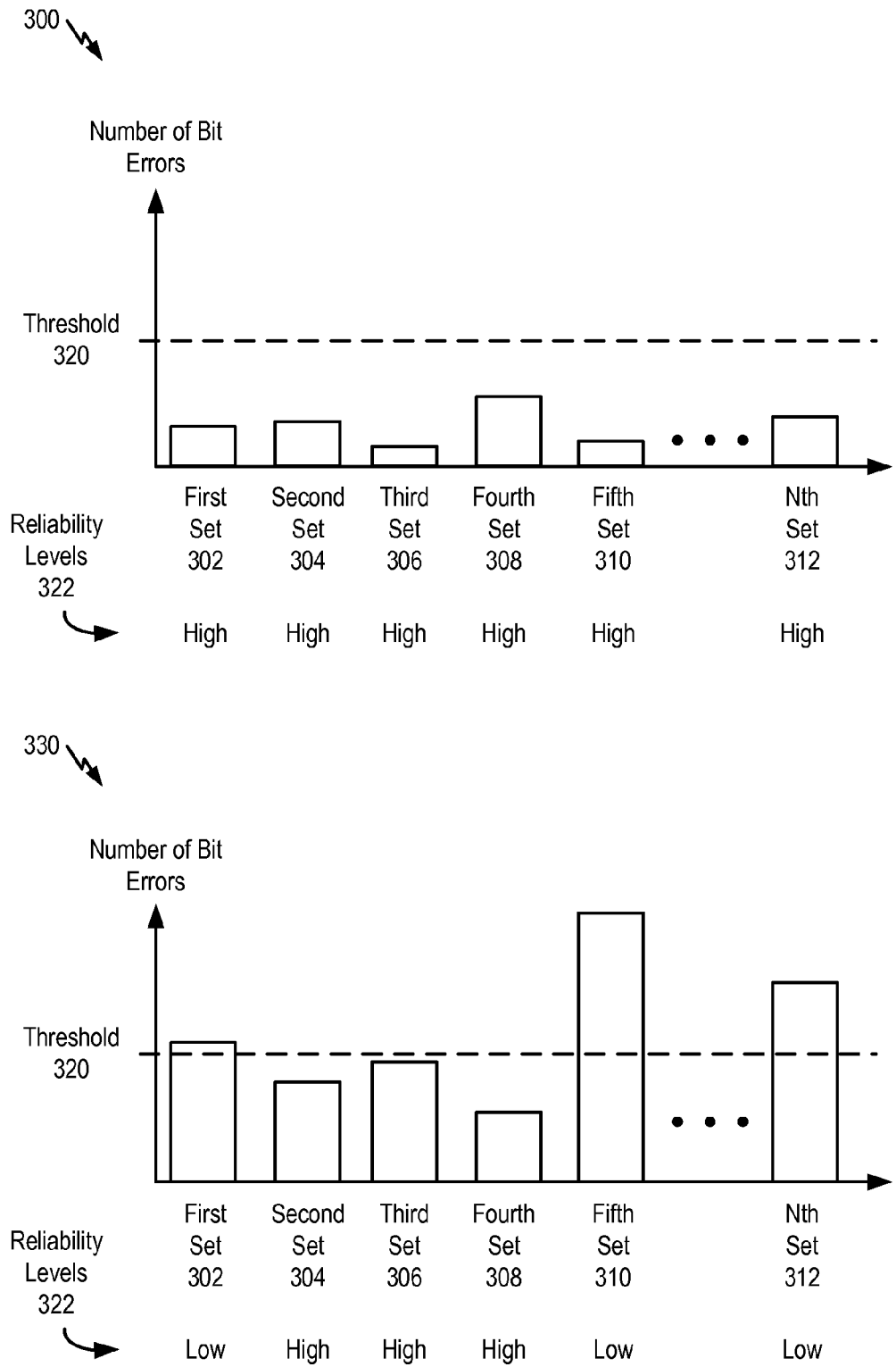
FIG. 3 illustrates charts of bit error counts (e.g., historical bit error data) and corresponding reliability levels for multiple sets of storage elements of a memory.

Referring to FIG. 3, charts of bit error counts (included in historical bit error data) and corresponding reliability levels for multiple sets of storage elements of a memory are illustrated. FIG. 3 illustrates a first chart 300 that illustrates counts of bit errors corresponding to a first set of storage elements 302, a second set of storage elements 304, a third set of storage elements 306, a fourth set of storage elements 308, a fifth set of storage elements 310, and an Nth set of storage elements 312. The sets of storage elements 302-312 may be groupings of storage elements of a memory of a data storage device, such as the memory 104 of the data storage device 102 of FIG. 1. In a particular implementation, the first set of storage elements 302 may include or correspond to the first set of storage elements 106 of FIGS. 1 and 2, and the second set of storage elements 304 may include or correspond to the second set of storage elements 206 of FIG. 2. Although N sets of storage elements are illustrated, in other implementations fewer than N or more than N sets of storage elements may be included.

The first chart 300 shows the counts of bit errors for the sets of storage elements 302-312 after an initial testing of the memory. For example, the initial testing may be performed during fabrication and production of the memory (e.g., prior to being provided to a customer). As shown in the first chart 300, at the time of the initial testing, the count of bit errors corresponding to each of the sets of storage elements 302-312 is less than a threshold 320. In a particular implementation, the threshold 320 is the threshold 262 of FIG. 2. Reliability levels 322 associated with the sets of storage elements 302-312 may be based on the counts of bit errors associated with the sets of storage elements 302-312. As illustrated in FIG. 3, after the initial testing, the counts of bit errors associated with each of the sets of storage elements 302-312 fail to exceed the threshold 320. Because the counts of bit errors fail to exceed the threshold 320, each of the sets of storage elements 302-312 may be associated with a high reliability level.

FIG. 3 also illustrates a second chart 330 that illustrates counts of bit errors associated with the sets of storage elements 302-312 at a particular time during the operational lifetime of the memory. As one example, the second chart 330 may indicate counts of bit errors after a particular number of program/erase (P/E) cycles to the memory. At the particular time corresponding to the second chart 330, counts of bit errors associated with the first set of storage elements 302, the fifth set of storage elements 310, and the Nth set of storage elements 312 exceed the threshold 320, and counts of bit errors associated with the second set of storage elements 304, the third set of storage elements 306, and the fourth set of storage elements 308 fail to exceed the threshold 320. Because the counts of bit errors associated with the first set of storage elements 302, the fifth set of storage elements 310, and the Nth set of storage elements 312 exceed the threshold 320 the first set of storage elements 302, the fifth set of storage elements 310, and the Nth set of storage elements 312 are associated with a low reliability level. The second set of storage elements 304, the third set of storage elements 306, and the fourth set of storage elements 308 fail to exceed the threshold 320 are still associated with a high reliability level. Although two reliability levels are described, in other implementations, more than two reliability levels may be defined, and more than one threshold may be used to distinguish between the more than two reliability levels.

Figure 4:
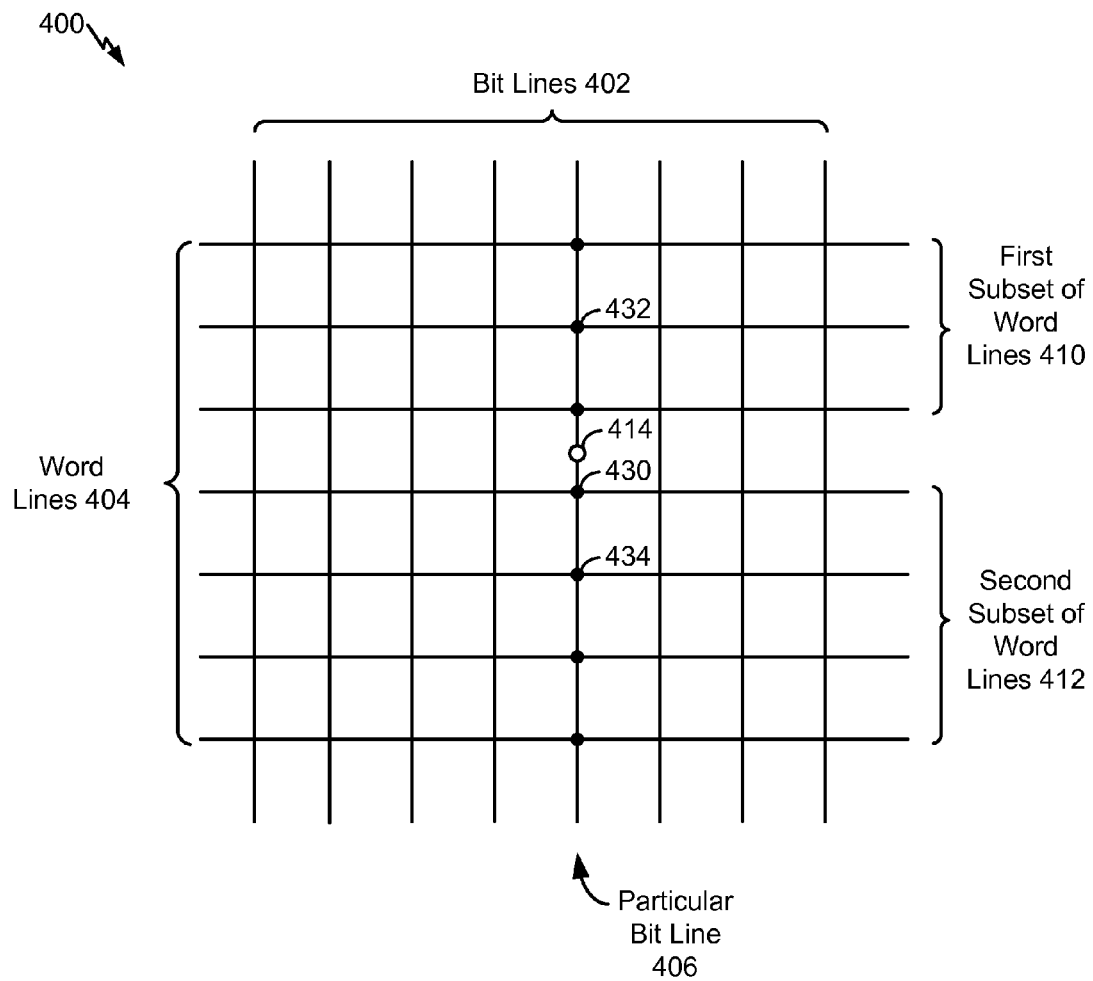
FIG. 4 is a diagram that illustrates a portion of a memory including at least one bit line having a defect and a table of reliability levels corresponding to storage elements coupled to the at least one bit line.

Referring to FIG. 4, a portion of a memory 400 that includes at least one bit line having a defect and a table 440 of reliability levels corresponding to storage elements coupled to the at least one bit line are illustrated. The portion of the memory 400 may include or correspond to a portion of the memory 104 of FIGS. 1 and 2.

As illustrated in FIG. 4, the portion of the memory 400 includes multiple bit lines 402 and multiple word lines 404. A storage element may be coupled to each intersection of one of the bit lines 402 and one of the word lines 404. The storage elements may be MLC storage elements, SLC storage elements, or a combination thereof. The storage elements may include a first storage element 430, a second storage element 432, and a third storage element 434.

Some bit lines in the memory may have defects (e.g., errors). For example, a bit line may have closed defects (e.g., defects that affect each storage elements coupled to the bit line) or open defects (e.g., defects that affect storage elements coupled to the bit line on one side of the defect but not storage elements coupled to the bit line on the other side of the defect). An open defect may affect storage elements coupled to the bit line "below" the open defect, in the orientation illustrated in FIG. 4. Although described as "below," in other orientations, an open defect may affect storage cells coupled to a bit line on a particular side (e.g., a known side) of the open defect.

In the example illustrated in FIG. 4, a particular bit line 406 has an open defect 414. Storage elements coupled to a first subset of word lines 410 are coupled to the particular bit line 406 on a first side (e.g., "above") of the open defect 414, and storage elements coupled to a second subset of word lines 412 are coupled to the particular bit line 406 on a second side (e.g., below) of the open defect 414. The first storage element 430 and the third storage element 434 are coupled to the particular bit line 406 on the second side of the open defect, and the second storage element 432 is coupled to the particular bit line 406 on the first side of the open defect 414.

As shown in the table 440, each of the storage elements 430-434 have a corresponding count of bit errors. At a particular time during the operational lifetime of the memory corresponding to the table 440, a count of bit errors associated with the first storage element 430 exceeds a threshold (e.g., the threshold 262 of FIG. 2), a count of bit errors associated with the second storage element 432 fails to exceed the threshold, and a count of bit errors associated with the third storage element 434 exceeds the threshold. Based on the counts of bit errors, the first storage element 430 and the third storage element 434 are associated with a low reliability level and the second storage element 432 is associated with a high reliability level. The reliability levels correctly predict the reliability of the storage elements 430-434 due to the open defect 414.

In some implementations, some of the storage elements 430-434 may not be read as often as others, and thus may not have time for the corresponding count of bit errors to exceed the threshold. In these implementations, storage elements coupled to a bit line on the second side (e.g., below) of a storage element having a count of errors that exceeds the threshold may be marked as having a low reliability, regardless of the count of bit errors. For example, the reliability engine 142 of FIG. 2 may determine that the count of bit errors associated with the first storage element 430 exceeds the threshold, and in response the reliability engine 142 may store an indication that storage elements coupled to the particular bit line 406 on the second side of the first storage element 430 have a low reliability. The reliability engine 142 may identify the storage elements using the bit line location data 266 of FIG. 2.

Although FIG. 4 illustrates particular storage elements as being associated with counts of bit errors, maintaining bit error information for each storage element may use substantial amounts of memory (e.g., the dedicated portion 108 of FIGS. 1 and 2 and the second memory 260 of FIG. 2). In other implementations, the counts of bit errors may correspond to bit lines. For example, a single count of bit errors may correspond to the particular bit line 406, and when a combined count of bit errors detected in any storage element coupled to the particular bit line 406 exceeds the threshold, each storage element coupled to the particular bit line 406 may be associated with the low reliability value. In other implementations, the counts of bit errors may correspond to column. In a particular implementation, a column may include eight bit lines. For example, a single count of bit errors may correspond to the bit lines 402 illustrated in FIG. 4, and when a combined count of bit errors detected in any storage element coupled to the bit lines 402 (e.g., the column) exceeds the threshold, each storage element coupled to the bit lines 402 may be associated with the low reliability value. In other implementations, columns may include fewer or more than eight bit lines. Maintaining bit error data for bit lines, or for columns, instead of for individual storage elements, reduces the storage space used to maintain the bit error information, which may reduce a cost of a memory (e.g., the memory 104 of FIGS. 1 and 2).

Figure 5:
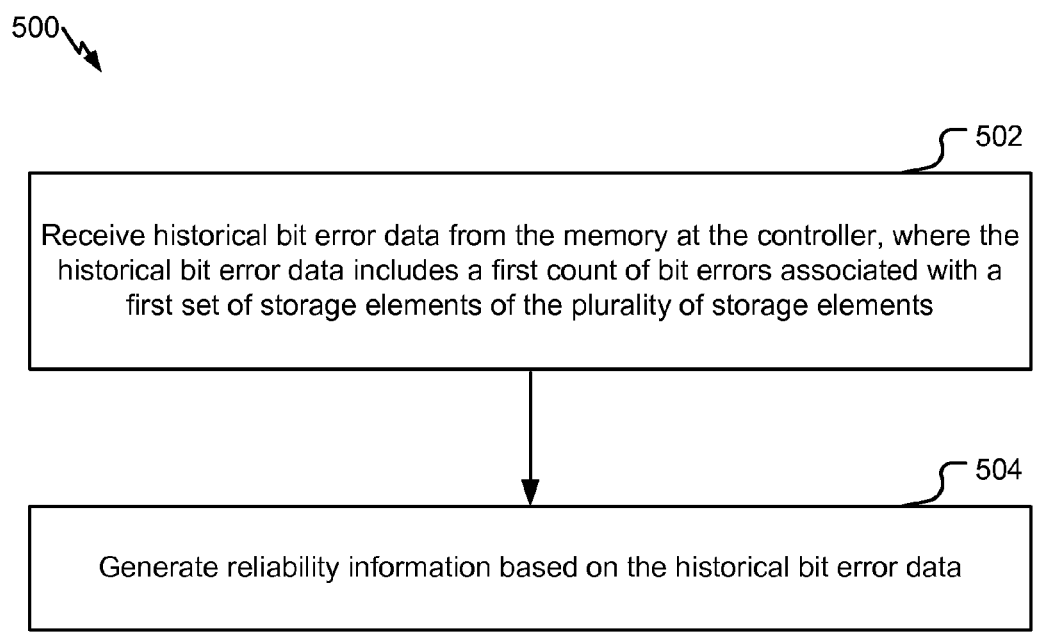
FIG. 5 is a flow diagram that illustrates a particular example of a method of generating reliability information based on historical bit error data.

Referring to FIG. 5, a particular illustrative example of a method of generating reliability information based on historical bit error data is depicted and generally designated 500. The method 500 may be performed at the data storage device 102, such as by the controller 120, or by the access device 250, or a combination thereof, as illustrative, non-limiting examples.

The method 500 may include receiving historical bit error data from the memory at the controller, at 502. The historical bit error data includes a first count of bit errors associated with a first set of storage elements of the plurality of storage elements. To illustrate, the reliability engine 142 may receive the historical bit error data 130 from the memory 104. The historical bit error data 130 may include the first count of bit errors 132 that is associated with the first set of storage elements 106. The method 500 may further include generating reliability information based on the bit error data, at 504. For example, the reliability engine 142 may generate the reliability information 134 based on the historical bit error data 130.

In a particular implementation, the reliability information may indicate that data read from the first set of storage elements has a first reliability level if the first count of bit errors exceeds a threshold. For example, with reference to FIG. 2, the reliability information 134 may indicate that the first set of storage elements 106 is associated with a first reliability level (e.g., a low reliability level) if the first count of bit errors 132 exceeds the threshold 262. Additionally, the reliability information may indicate that the data read from the first set of storage elements has a second reliability level if the first count of bit errors fails to exceed the threshold, where the second reliability level is higher than the first reliability level. For example, with reference to FIG. 2, the reliability information 134 may indicate that the second set of storage elements 206 is associated with a second reliability level (e.g., a high reliability level) if the second count of bit errors 232 exceeds the threshold 262.

In some implementations, the first count of bit errors may track a number of errors detected during one or more decode operations performed on data read from the first set of storage elements. For example, the first count of bit errors 132 may track a number of errors detected by the ECC engine 140 during one or more decode operations performed on the first data 230 from the first set of storage elements 106. In a particular implementation, the first set of storage elements may be coupled to a column of the memory, the column including multiple bit lines. In another particular implementation, the first set of storage elements may be coupled to a bit line of the memory. In another particular implementation, the first set of storage elements include a particular storage element coupled to a particular bit line and to a particular word line. For example, with reference to FIG. 4, the first set of storage elements 106 may correspond to the first storage element 430 coupled to the particular bit line 406. If the first count of bit errors exceeds a threshold, the reliability information indicates that data read from a first subset of storage elements has the same reliability level as data read from the particular storage element and that data read from a second subset of storage elements has a different reliability level than the data read from the particular storage element. For example, with reference to FIG. 4, the first storage element 430 may be coupled to the particular bit line 406 having the open defect 414. The first subset of word lines 410 may be associated with a high reliability level and the second subset of word lines 412 may be associated with a low reliability level based on the location of the open defect 414.

Thus, the method 500 may enable generation of the reliability information based on the historical bit error data. The reliability information may enable an ECC engine to decode read data faster and using less processing power. Additionally, the reliability information may be generated with less complexity than generating other soft bits that are used for reliability information.

Figure 6:
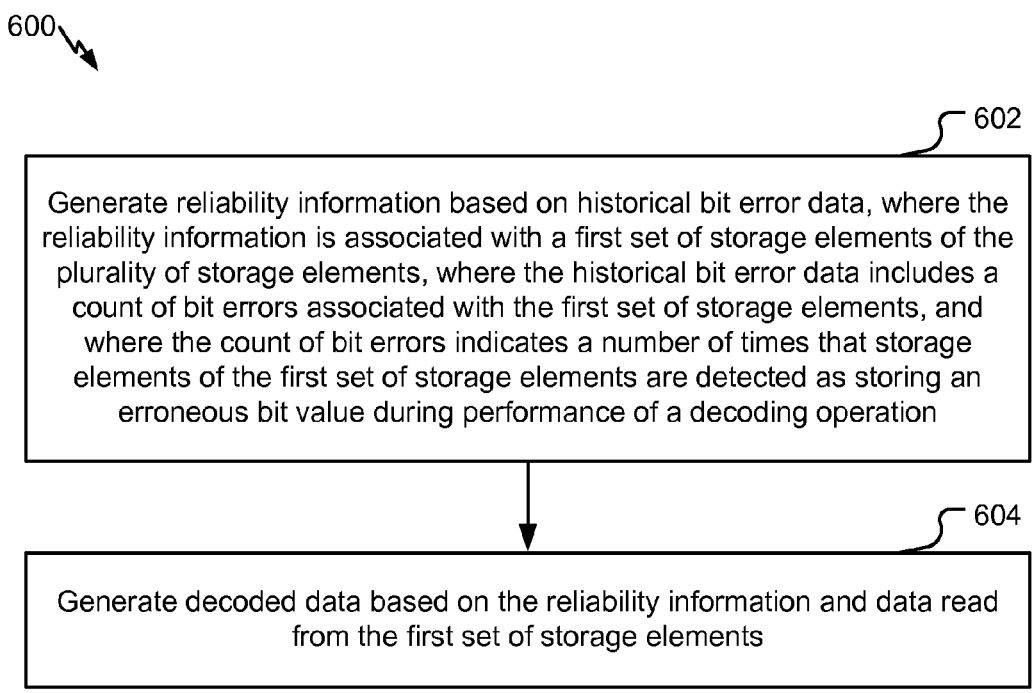
FIG. 6 is a flow diagram that illustrates a particular example of a method of generating decoded data based on reliability information.

Referring to FIG. 6, a particular illustrative example of a method of generating decoded data based on reliability information is depicted and generally designated 600. The method 600 may be performed at the data storage device 102, such as by the controller 120, or the access device 250, or a combination thereof, as illustrative, non-limiting examples.

The method 600 may include generating reliability information based on historical bit error data, at 602. The reliability information may be associated with a first set of storage elements of the plurality of storage elements, and the historical bit error data may include a count of bit errors associated with the first set of storage elements. The count of bit errors may indicate a number of times that data read from the first set of storage elements is detected as having an erroneous bit value during performance of decoding operations. To illustrate, the reliability engine 142 may generate the reliability information 134 based on the historical bit error data 130. The reliability information 134 may be associated with the first set of storage elements 106. The historical bit error data 130 may include the first count of bit errors 132 that indicates a number of times that storage elements of the first set of storage elements 106 are detected by the ECC engine 140 as storing an erroneous bit value during performance of decoding operations.

The method 600 may further include generating decoded data based on the reliability information and the data read from the first set of storage elements, at 604. For example, with reference to FIG. 2, the ECC engine 140 may generate the decoded data 238 based on the reliability information 134 and the first data 230 read from the first set of storage elements 106.

In a particular implementation, the method 600 includes receiving the historical bit error data from the memory in response to initiating a read operation at the memory. For example, with reference to FIG. 2, the historical bit error data 130 is received from the memory 104 (e.g., the dedicated portion 108) at the reliability engine 142 in response to a read operation initiated at the memory 104. Alternatively, the historical bit error data 130 may be retrieved from the memory 104 and stored in the second memory 260 in response to a power-on operation of the controller 120.

In another particular implementation, the method 600 may include detecting a set of bit errors in the data read from the first set of storage elements during generation of the decoded data and updating the historical bit error data based on the set of bit errors. For example, the ECC engine 140 may detect one or more bit errors during generation of the decoded data 238, and the ECC engine 140 may provide the indication of bit errors 236 to the reliability engine 142. The reliability engine 142 may generate the updated historical bit error data 234 based on the indication of bit errors 236. The method 600 may further include storing the updated historical bit error data in the memory. For example, the updated historical bit error data 234 may be stored at the memory 104 (overwriting or replacing the historical bit error data 130). The updated historical bit error data 234 may be stored periodically, in response to a power-down event of the controller 120, or at other times. Additionally or alternatively, updating the historical bit error data may include incrementing the count of bit errors for each bit error in the set of bit errors. For example, the reliability engine 142 may update the first count of bit errors 132 for each bit error that is indicated by the indication of bit errors 236 and that is associated with the first set of storage elements 106.

In another particular implementation, the method 600 further includes performing a normalization operation on the count of bit errors based on a count of decode operations. For example, the reliability engine 142 may perform a normalization operation on the first count of bit errors 132, the second count of bit errors 232, or both, based on the decode operation counts 264, as described with reference to FIG. 2. Additionally or alternatively, the reliability information may indicate that the data read from the first set of storage elements has a low reliability level if the count of bit errors exceeds a threshold. For example, if the first count of bit errors 132 exceeds the threshold 262, the reliability information 134 indicates that the first set of storage elements 106 (and the first data 230) is associated with a low reliability level. Additionally or alternatively, the reliability information may indicate that the data read from the first set of storage elements has a high reliability level if the count of bit errors fails to exceed the threshold. For example, if the second count of bit errors 232 fails to exceed the threshold 262, the reliability information 134 indicates that the second set of storage elements 206 (and the second data 231) is associated with a high reliability level.

Thus, the method 600 may enables generation of decoded data with increased speed and with decreased processing power. In some implementations, the method 600 also enables updating of historical bit error data used to generate reliability data, which enables the reliability information to respond to changes in a memory that stores the data being decoded.

The method 500 of FIG. 5 and/or the method 600 of FIG. 6 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, method 500 of FIG. 5 and/or the method 600 of FIG. 6 can be initiated or controlled by one or more processors, such as one or more processors included in or coupled to a controller or a memory of the data storage device 102 and/or the access device 250 of FIGS. 1 and 2. As an example, one or more of the methods of FIGS. 5 and 6, individually or in combination, may be performed by the controller 120 of FIG. 1. To illustrate, a portion of one of the methods FIGS. 5 and 6 may be combined with a second portion of one of the methods of FIGS. 5 and 6. Additionally, one or more operations described with reference to the FIGS. 5 and 6 may be optional, may be performed at least partially concurrently, and/or may be performed in a different order than shown or described.

In an illustrative example, a processor may be programmed to decode a representation of read data using bit line defect information that identifies bit lines having defects that affect a group of storage elements of a memory that stores the read data. For example, the processor may execute instructions to receive first bit line defect information from a memory. The first bit line defect information may identify bit lines having defects that affect a first group of storage elements of a plurality of storage elements of the memory. The processor may execute instructions to generate a first set of soft bits based on the first bit line defect information. The processor may further execute instructions to generate first decoded data based on the first set of soft bits and a representation of first read data. The first read data may be stored at the first group of storage elements.

Although various components of the data storage device 102 and/or the access device 250 of FIGS. 1 and 2 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 500 of FIG. 5 and/or the method 600 of FIG. 6. In a particular implementation, each of the controller 120, the memory 104, the second memory 260, and/or the access device 250 of FIGS. 1 and 2 includes a processor executing instructions that are stored at a memory, such as a non-volatile memory of the data storage device 102 or the access device 250 of FIGS. 1 and 2. Alternatively or additionally, executable instructions that are executed by the processor may be stored at a separate memory location that is not part of the non-volatile memory, such as at a read-only memory (ROM) of the data storage device 102 or the access device 250 of FIGS. 1 and 2.

With reference to FIGS. 1 and 2, the data storage device 102 may be attached to or embedded within one or more access devices, such as within a housing of a communication device (e.g., the access device 250). For example, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, a system integrated within a vehicle, such as a console display unit, or other device that uses non-volatile memory. However, in other embodiments, the data storage device 102 may be implemented in a portable device configured to be selectively coupled to one or more external access devices. In still other embodiments, the data storage device 102 may be a component (e.g., a solid-state drive (SSD)) of a network accessible data storage system, such as an enterprise data system, a network-attached storage system, a cloud data storage system, etc.

To further illustrate, the data storage device 102 may be configured to be coupled to the access device 250 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In yet another particular implementation, the data storage device 102 is coupled to the access device 250 indirectly, e.g., via a network. For example, the data storage device 102 may be a network-attached storage (NAS) device or a component (e.g., a solid-state drive (SSD) device) of a data center storage system, an enterprise storage system, or a storage area network.

The memory 104 and/or the second memory 260 of FIGS. 1 and 2 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 and/or the second memory 260 may include another type of memory. The memory 104 and/or the second memory 260 of FIGS. 1 and 2 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a memory including a plurality of storage elements; and
   a controller coupled to the memory, wherein the controller comprises:
   an error correction code (ECC) engine; and
   a reliability engine configured to access historical bit error data, wherein the historical bit error data includes a first count value of bit errors associated with a first group of storage elements of the plurality of storage elements, wherein the reliability engine is configured to generate reliability information based on the historical bit error data and to provide the reliability information to the ECC engine, and wherein the reliability engine is further configured to track, based data read from the first group of storage elements, a first number of errors having a first error type and a second number of errors having a second error type.

2. The data storage device of claim 1, wherein the reliability engine is configured to access the historical bit error data from a controller memory and to update the historical bit error data based on the first number of errors and the second number of errors.

3. The data storage device of claim 1, wherein the memory comprises a non-volatile memory, and wherein the reliability engine is configured to access the historical bit error data from the non-volatile memory.

4. The data storage device of claim 1, wherein the reliability information indicates a reliability of a first plurality of bits read from the first group of storage elements, and wherein the ECC engine is configured to process the reliability information to decode the first plurality of bits read from the first group of storage elements.

5. The data storage device of claim 1, wherein the historical bit error data includes a second count value of bit errors associated with a second group of storage elements of the plurality of storage elements, and wherein the first count value and the second count value of bit errors are determined based on decoding operations performed by the ECC during a lifetime of the memory.

6. The data storage device of claim 1, wherein the reliability engine is further configured to to update the historical bit error data based on the first number of errors and the second number of errors.

7. The data storage device of claim 6, wherein the reliability engine is further configured to send the updated historical bit error data to the memory.

8. The data storage device of claim 1, wherein the ECC engine is configured to provide an indication of one or more bit errors to the reliability engine in response to detecting the one or more bit errors during a background scanning operation.

9. The data storage device of claim 1, wherein the ECC engine is further configured to provide a no-error indicator to the reliability engine in response to no bit errors being detected during a decoding operation based on the data read from the first group of storage elements, and wherein the reliability engine is further configured to modify the first count value based on the no-error indicator.

10. The data storage device of claim 1, wherein the ECC engine is further configured to determine one or more bit errors during a decoding process based on the data read from the first group of storage elements and to generate a timestamp associated with the one or more bit errors, and wherein a reliability information weight associated with the reliability information is based on the timestamp.

11. The data storage device of claim 1, wherein the first error type is associated with a first reliability weight, and wherein the second error type is associated with a second reliability weight.

12. The data storage device of claim 1, wherein the first group of storage elements includes multiple storage elements coupled to the same bit line.

13. A method comprising:
    at a data storage device including a memory and a controller coupled to the memory,
        wherein the memory includes a plurality of storage elements, performing:
        accessing historical bit error data at the controller, wherein the historical bit error data includes a first count value of bit errors associated with a first group of storage elements of the plurality of storage elements;
        generating reliability information based on the historical bit error data; and
        tracking, based on data read from the first group of storage elements, a first number of errors having a first error type and a second number of errors having a second error type.

14. The method of claim 13, wherein the reliability information indicates that the data read from the first group of storage elements has a first reliability level if the first count value exceeds a threshold.

15. The method of claim 14, wherein the reliability information indicates that the data read from the first group of storage elements has a second reliability level if the first count value fails to exceed the threshold, and wherein the second reliability level is higher than the first reliability level.

16. The method of claim 13, wherein the first error type corresponds to 0-to-1 errors, and wherein the second error type corresponds to 1-to-0 errors.

17. The method of claim 13, wherein the first group of storage elements is coupled to a particular column of the memory, the particular column including multiple bit lines.

18. The method of claim 13, wherein the first group of storage elements is coupled to a particular bit line of the memory.

19. The method of claim 13, wherein the first group of storage elements comprises a first storage element coupled to a particular bit line and to a particular word line and a second storage element coupled to the particular bit line, wherein, if the first count value exceeds a threshold, the reliability information indicates that data read from a first subset of storage elements has the same reliability level as data read from the first storage element and that data read from a second subset of storage elements has a different reliability level than the data read from the first storage element.

20. An apparatus comprising:
    means for generating reliability information based on historical bit error data, wherein the reliability information is associated with a first group of storage elements of a memory, wherein the historical bit error data includes a count value of bit errors associated with the first group of storage elements, wherein the count value indicates a number of times that data read from the first group of storage elements is detected as having an erroneous bit value during performance of decoding operations;
    means for tracking, based on data read from the first group of storage elements, a first number of errors having a first error type and a second number of errors having a second error type; and
    means for generating decoded data based on the reliability information and the data read from the first group of storage elements.

21. The apparatus of claim 20, further comprising means for retrieving the historical bit error data from the memory in response to initiating a read operation at the memory.

22. The apparatus of claim 20, further comprising means for updating the historical bit error data based on the first number of errors and the second number of errors.

23. The apparatus of claim 22, wherein the updated historical bit error data is stored in the memory.

24. The method apparatus of claim 20, further comprising means for updating the historical bit error data based on a second count value associated with decoded data based on the data read from the first group of storage elements and the reliability information.

25. The apparatus of claim 20, wherein the means for generating is further configured to perform a normalization operation on the count value based on a count of decode operations performed on the data read from the first group of storage elements.

26. The apparatus of claim 20, wherein the reliability information indicates that the data read from the first group of storage elements has a high reliability level if the count value fails to exceed a threshold.

* * * * *